United States Patent
Ito

(10) Patent No.: US 11,718,768 B2
(45) Date of Patent: Aug. 8, 2023

(54) POLISHING COMPOSITION, POLISHING METHOD, AND METHOD OF PRODUCING SEMICONDUCTOR SUBSTRATE

(71) Applicant: FUJIMI INCORPORATED, Aichi (JP)

(72) Inventor: Daiki Ito, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 17/171,393

(22) Filed: Feb. 9, 2021

(65) Prior Publication Data
US 2021/0253905 A1   Aug. 19, 2021

(30) Foreign Application Priority Data
Feb. 18, 2020 (JP) .................. 2020-025618

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 2002/0098697 A1* | 7/2002 | Shimazu | C09G 1/02 438/691 |
| 2013/0045599 A1* | 2/2013 | Ye | H01L 21/7684 438/693 |
| 2016/0053381 A1* | 2/2016 | Tsai | C23F 3/06 252/79.1 |
| 2016/0068710 A1* | 3/2016 | Wang | H01L 21/3212 438/693 |
| 2017/0051181 A1* | 2/2017 | Grumbine | C09K 3/1436 |
| 2017/0158913 A1* | 6/2017 | Reichardt | C09G 1/02 |

FOREIGN PATENT DOCUMENTS

JP    2007-103515 A    4/2007

* cited by examiner

*Primary Examiner* — Roberts P Culbert
(74) *Attorney, Agent, or Firm* — Katten Muchin Rosenman LLP

(57) ABSTRACT

A polishing composition according to the present invention contains silica, a nitrogen-containing alkaline compound, and hydrogen peroxide, in which a content of the hydrogen peroxide is more than 0% by mass and less than 0.03% by mass with respect to the total mass of the polishing composition, and a pH exceeds 9.

11 Claims, No Drawings

POLISHING COMPOSITION, POLISHING METHOD, AND METHOD OF PRODUCING SEMICONDUCTOR SUBSTRATE

BACKGROUND

1. Technical Field

The present invention relates to a polishing composition, a polishing method, and a method of producing a semiconductor substrate.

2. Description of Related Arts

In recent years, a so-called chemical mechanical polishing (CMP) technique for polishing and flattening a semiconductor substrate in producing a device has been used in accordance with multilayer wiring on a surface of a semiconductor substrate. The CMP is a method for flattening a surface of an object to be polished (target object) such as a semiconductor substrate by using a polishing composition (slurry) containing abrasive grains such as silica, alumina, or ceria, an anti-corrosion agent, a surfactant, or the like. The object to be polished (target object) is silicon, polysilicon, silicon oxide film (silicon oxide), silicon nitride, a wiring or a plug which consists of metal, for example, or the like.

For example, as a technique for polishing a polysilicon film provided on a silicon substrate including a separation region, JP 2007-103515 A (US Patent Application Publication No. 2007/0077764, China Patent Application Publication No. 1939663, and Singapore Patent Application Publication No. 131099) discloses a polishing method including a step of pre-polishing using a pre-polishing composition containing abrasive grains, alkali, water-soluble polymer, and water, and a step of finish polishing using a finish polishing composition containing abrasive grains, alkali, water-soluble polymer, and water.

SUMMARY

Recently, as a semiconductor substrate, a substrate containing both polycrystalline silicon which is not doped with impurities and polycrystalline silicon doped with n-type impurities has been used, and in such a substrate, there is a new demand for selectively polishing the polycrystalline silicon which is not doped with impurities. No consideration has been given to such demands in the related art.

Therefore, an object of the present invention is to provide a polishing composition in which polishing speed of polycrystalline silicon which is not doped with impurities is sufficiently high, and a ratio of the polishing speed of the polycrystalline silicon which is not doped with impurities to polishing speed of polycrystalline silicon which is doped with n-type impurities is sufficiently high (that is, a high selectivity).

In order to solve the above new problems, the inventors of the present invention have conducted intensive studies. As a result, the inventors have been found that the above-mentioned problems can be solved by a polishing composition that contains silica, a nitrogen-containing alkaline compound, and hydrogen peroxide, in which a content of the hydrogen peroxide is more than 0% by mass and less than 0.03% by mass with respect to the total mass of the polishing composition, and a pH exceeds 9, and have completed the present invention.

DETAILED DESCRIPTION

Hereinbelow, the embodiments of the present invention are described. However, the present invention is not limited to the following embodiments. In the present specification, unless otherwise specified, measurements of operations, physical properties, and the like are performed under the conditions of room temperature (20° C. or more and 25° C. or less)/relative humidity 40% RH or more and 50% RH or less.

The polishing composition according to one embodiment of the present invention contains silica, a nitrogen-containing alkaline compound, and hydrogen peroxide, in which a content of the hydrogen peroxide is more than 0% by mass and less than 0.03% by mass with respect to the total mass of the polishing composition, and a pH exceeds 9.

In the polishing composition of the present invention having such a configuration, polishing speed of polycrystalline silicon which is not doped with impurities is sufficiently high, and a ratio of the polishing speed of the polycrystalline silicon which is not doped with impurities to polishing speed of polycrystalline silicon which is doped with n-type impurities is sufficiently high (that is, a high selectivity).

A mechanism by which the above effects are obtained is considered to be as follows. However, the following mechanism is only speculation, and the scope of the present invention is not limited by this. In the present specification, the polycrystalline silicon which is not doped with impurities is also simply referred to as "undoped polysilicon", and the polycrystalline silicon which is doped with n-type impurities is also simply referred to as "n-type doped polysilicon". Further, the ratio of the polishing speed of the polycrystalline silicon which is not doped with impurities to the polishing speed of the polycrystalline silicon which is doped with n-type impurities is also simply referred to as "selectivity".

In general, under alkaline conditions, polysilicon has a higher polishing speed, and the higher the pH, the higher the polishing speed. The nitrogen-containing alkaline compound acts as a nucleophile, nucleophilic addition is made to the surface of the undoped polysilicon to weaken the silicon-silicon bond of the undoped polysilicon to further improve the polishing speed of the undoped polysilicon. Further, the polishing composition of the present invention further contains hydrogen peroxide, which is an oxidizing agent, and the surface of n-type doped polysilicon, which is easily oxidized, becomes silicon oxide ($SiO_2$) by the action of hydrogen peroxide. Since $SiO_2$ is chemically stable and is not easily affected by pH and nucleophiles, the polishing speed of n-type doped polysilicon decreases. On the other hand, similar oxidation occurs on the surface of undoped polysilicon, but since the polishing composition of the present invention contains only a very small amount of hydrogen peroxide, the oxidation reaction on the surface of undoped polysilicon is more difficult to proceed than on the surface of n-type doped polysilicon. Therefore, the surface of the undoped polysilicon is affected by the pH of the polishing composition and the nitrogen-containing alkaline compound, and the polishing speed is maintained at a high level. With such a mechanism of action, it is considered that the above effects can be obtained according to the polishing composition of the present invention.

[Object to be Polished]

The object to be polished according to the present invention is not particularly limited, and examples thereof preferably include polycrystalline silicon which is not doped with impurities (undoped polysilicon) and polycrystalline silicon doped with n-type impurities (n-type doped polysilicon).

Examples of the n-type impurities include Group 15 elements such as phosphorus (P), arsenic (As), bismuth (Bi), and antimony (Sb). Among these n-type impurities, phosphorus is preferable.

The lower limit of the content (doped amount) of n-type impurities is not particularly limited, and is preferably $1.0 \times 10^{13}$ atoms/cc or more, and more preferably $2.0 \times 10^{13}$ atoms/cc or more in the measurement by secondary ion mass spectrometry (SIMS). The upper limit of the content (doped unt) of the n-type impurities is not particularly limited, and is preferably $5.0 \times 10^{21}$ atoms/cc or less, and more preferably $4.0 \times 10^{21}$ atoms/cc or less.

The object to be polished according to the present invention may contain other materials other than the above-mentioned polysilicon. Examples of other materials include silicon nitride, silicon carbon nitride (SiCN), silicon oxide, metals, SiGe, and the like.

Examples of the object to be polished containing silicon oxide include a TEOS-type silicon oxide surface (hereinafter, also simply referred to as "TEOS") produced by using tetraethyl orthosilicate as a precursor, an HDP film, a USG film, a PSG film, a BPSG film, an RTO film, and the like.

Examples of the metal include tungsten, copper, aluminum, cobalt, hafnium, nickel, gold, silver, platinum, palladium, rhodium, ruthenium, iridium, osmium, and the like.

[Silica]

The polishing composition of the present invention contains silica as abrasive grains. The type of silica is preferably colloidal silica. Examples of the method of producing colloidal silica include a sodium silicate method, a sol-gel method, and the like and any colloidal silica produced by any of the production methods is preferably used as the silica according to the present invention. However, from the viewpoint of reducing the metal impurities, colloidal silica produced by the sol-gel method, which can be produced with high purity, is preferable.

Here, a shape of the silica is not particularly limited, and may be a spherical shape or a non-spherical shape. Specific examples of the non-spherical shape include various shapes of a polygonal column shape such as a triangular column and a square column, a column shape, a pillow shape in which the center of a column bulges more than ends, a donut shape having a hole at the center of a disc, a plate shape, a so-called silk cocoon shape having a constriction at the center, a so-called associated sphere shape in which a plurality of particles are integrated, a so-called Kompeitoh shape having a plurality of projections on the surface, and the like.

Further, the surface of the colloidal silica may be surface-modified with a silane coupling agent or the like.

Examples of the method of surface-modifying the surface of colloidal silica with a silane coupling agent include an immobilization method as described below. It can be performed by, for example, a method disclosed in "Sulfonic acid-functionalized silica through of thiol groups", Chem. Commun. 246-247 (2003). Specifically, when coupling a silane coupling agent having a thiol group such as 3-mercaptopropyltrimethoxysilane to colloidal silica and then oxidizing the thiol group with hydrogen peroxide, colloidal silica in which sulfonic acid is immobilized on the surface can be obtained.

It can be performed by, for example, a method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, when coupling a silane coupling agent containing a photoreactive 2-nitrobenzyl ester to colloidal silica, and then irradiating colloidal silica with light, colloidal silica in which the carboxylic acid is immobilized on the surface can be obtained.

The above is colloidal silica having an anionic group (anion-modified colloidal silica), but colloidal silica having a cationic group (cation-modified colloidal silica) may be used. Examples of the colloidal silica having a cationic group include colloidal silica in which an amino group is immobilized on the surface. Examples of a method of producing colloidal silica having such a cationic group include, as disclosed in JP 2005-162533 A, a method for immobilizing a silane coupling agent having an amino group such as aminoethyl trimethoxysilane, aminopropyl trimethoxysilane, aminoethyl triethoxysilane, aminopropyl triethoxysilane, aminopropyl dimethyl ethoxysilane, aminopropyl methyl diethoxysilane, and aminobutyl triethoxysilane on the surface of the colloidal silica. With this, it is possible to obtain colloidal silica in which an amino group is immobilized on the surface.

The size of silica is not particularly limited. For example, in a case where the silica has a spherical shape, the average primary particle size of the silica is preferably 10 nm or more, more preferably 20 nm or more, and further preferably 30 nm or more. As the average primary particle size of silica is increased, the polishing speed of the object to be polished by the polishing composition is improved. In addition, the average primary particle size of the silica is preferably 300 nm or less, more preferably 250 nm or less, and further preferably 200 nm or less. As the average primary particle size of silica becomes smaller, it becomes easier to obtain a surface with few defects by polishing with the polishing composition. That is, the average primary particle size of silica is preferably 10 nm or more and 300 nm or less, more preferably 20 nm or more and 250 nm or less, and further preferably 30 nm or more and 200 nm or less. Note that the average primary particle size of silica can be calculated, for example, based on the specific surface area (SA) of silica calculated by the BET method, assuming that the shape of silica is a true sphere. In the present specification, the average primary particle size of silica adopts a value measured by the method described in examples.

In addition, the average secondary particle size of the silica is preferably 30 nm or more, more preferably 40 nm or more, and further preferably 50 nm or more. As the average secondary particle size of silica is increased, the resistance during polishing is decreased, and stable polishing becomes possible. In addition, the average secondary particle size of the silica is preferably 400 nm or less, more preferably 350 nm or less, and further preferably 300 nm or less. As the average secondary particle size of silica is decreased, the surface area of silica per unit mass is increased, the frequency of contact with the object to be polished is increased, and the polishing speed is further improved. That is, the average secondary particle size of silica is preferably 30 nm or more and 400 nm or less, more preferably 40 nm or more and 350 nm or less, and further preferably 50 nm or more and 350 nm or less. Note that, the average secondary particle size of the silica can be measured, for example, by a laser diffraction scattering method, based on a dynamic light scattering method.

An average association degree of the silica is preferably 5.0 or lower, more preferably 4.0 or lower, and still more preferably 3.0 or lower. As the average association degree of the silica is decreased, defects can be further reduced. An average association degree of the silica is preferably 1.0 or more, more preferably 1.5 or more, and still more preferably 2.0 or more. The average association degree of the silica can be obtained by dividing the value of the average secondary particle size of the silica by the value of the average primary particle size. As the average association degree of the silica is increased, there is an advantageous effect that the polishing speed of the object to be polished by the polishing composition is improved.

The upper limit of an aspect ratio of the silica in the polishing composition is not particularly limited, but is preferably lower than 2.0, more preferably 1.8 or lower, and still more preferably 1.5 or lower. Within such a range, it is possible further reduce the defects on the surface of the object to be polished. The aspect ratio is an average value obtained by taking the smallest rectangle circumscribing the image of a silica particle with a scanning electron microscope and dividing the length of a long side of the rectangle by the length of a short side of the same rectangle, and can be determined using general image analysis software. The lower limit of the aspect ratio of the silica in the polishing composition is not particularly limited, but is preferably 1.0 or higher.

In a particle size distribution of the silica, which is obtained by the laser diffraction scattering method, the lower limit of D90/D10 which is a ratio of a particle diameter (D90) when the accumulated particle weight reaches 90% of total particle weight from the particle side to a particle diameter (D10) when the accumulated particle weight reaches 10% of total particle weight from the particle side is not particularly limited, and it is preferably 1.1 or more, more preferably 1.3 or more, still more preferably 1.5 or more, even still preferably 1.7 or more, and most preferably 2.0 or more. In the particle size distribution of the silica in the polishing composition, which is obtained by the laser diffraction scattering method, the upper limit of D90/D10 which is a ratio of a particle diameter (D90) when the accumulated particle weight reaches 90% of total particle weight from the particle side to a particle diameter (D10) when the accumulated particle weight reaches 10% of total particle weight from the particle side is not particularly limited, and it is preferably 2.04 or less. Within such a range, it is possible further reduce the defects on the surface of the object to be polished.

The size of the silica (average primary particle size, average secondary particle size), aspect ratio, D90/D10, and the like can be appropriately controlled by the selection and the like of the method for producing the silica.

The content (concentration) of silica is not particularly limited, and is preferably 0.1% by mass or more, more preferably 0.2% by mass or more, and still more preferably 1% by mass or more, based on the total mass of the polishing composition. Further, the upper limit of the silica content is preferably 20% by mass or less, more preferably 10% by mass or less, still more preferably 5% by mass or less, and most preferably 3% by mass or less, based on the total mass of the polishing composition. That is, the content of silica is preferably 0.1% by mass or more and 20% by mass or less, more preferably 0.2% by mass or more and 10% by mass or less, still more preferably 1% by mass or more and 5% by mass or less, and most preferably 1% by mass or more and 3% by mass or less, based on the total mass of the polishing composition. Within such a range, the polishing speed can be improved while suppressing the cost. Note that, in a case where the polishing composition contains two or more types of silica, the content of the silica is intended to be the total amount of these.

The silica may be used either singly or in combination of two or more types. Further, as silica, a commercially available product or a synthetic product may be used.

The polishing composition of the present invention may further contain abrasive grains other than silica as long as it contains silica as abrasive grains. Examples of other abrasive grains include metal oxides such as alumina, zirconia, and titania.

[Nitrogen-Containing Alkaline Compound]

The polishing composition of the present invention contains a nitrogen-containing alkaline compound. By containing such a compound, an increase in the electrical conductivity of the polishing composition is suppressed, an electric double layer on the surface of silica, which is an abrasive grain, tends to be thick, and it is difficult to contact the surface of the object to be polished (n-type doped polysilicon) oxidized by hydrogen peroxide. Therefore, the polishing speed of the n-type doped polysilicon is suppressed, and the selectivity is improved.

Examples of the nitrogen-containing alkaline compound include an amine compound such as allylamine, isopropylamine, diisopropylamine, ethylamine, diethylamine, triethylamine, 2-ethylhexylamine, 3-ethoxypropylamine, diisobutylamine, 3-diethylaminopropylamine, tri-n-octylamine, t-butylamine, sec-butylamine, propylamine, methylaminopropylamine, dimethylaminopropylamine, n-propanolamine, butanolamine, 2-Amino-4-pentanol, 2-amino-3-hexanol, 5-amino-4-octanol, 3-amino-3-methyl-2-butanol, monoethanolamine, N,N-dimethylethanolamine, isopropanolamine, neopentanolamine, diglycolamine, ethylenediamine, 1,3-diaminopropane, 1,2-diaminopropane, 1,6-diaminohexane, 1,9-diaminononane, 1,12-diaminododecane, dimeric fatty acid diamine, 2,4,4-trimethylhexamethylenediamine, hexamethylenediamine, N-aminoethylpiperazine, N-aminopropylpiperazine, N-aminopropyldipiperidipropane, and piperazine; and basic amino acid such as L-lysine, D-lysine, DL-lysine, L-arginine, D-arginine, DL-arginine, D-histidine, L-histidine, DL-histidine, D-citrulline, L-citrulline, DL-citrulline, D-ornithine, L-ornithine, DL-ornithine, and the like.

Among these, basic amino acid is preferable, D-histidine, L-histidine, DL-histidine, L-arginine, D-arginine, and DL-arginine are more preferable, and L-arginine, D-arginine, and DL-arginine are still more preferable.

The nitrogen-containing alkaline compound may be used either singly or in combination of two or more types. Further, as the nitrogen-containing alkaline compound, a commercially available product or a synthetic product may be used.

Among these nitrogen-containing alkaline compounds, basic amino acid is preferable. It is thought that the amino group contained in the basic amino acid is easily hydrogen-bonded with a silanol group on the surface of the object to be polished (particularly oxidized n-type doped polysilicon), and an alkylene group contained in the basic amino acid is easily adsorbed on the surface of the object to be polished. By such an action, it is considered that the basic amino acid acts as a protective film on the surface of the n-type doped polysilicon, the polishing speed of the n-type doped polysilicon is further suppressed, and the selectivity is further improved.

Further, since the carboxy group contained in the basic amino acid faces the side opposite to the surface side of the n-type doped polysilicon, a zeta potential on the surface of the n-type doped polysilicon is kept negative. In the polishing composition of the present application, which is alkaline, it is considered that the zeta potential on the surface of silica, which is an abrasive grain, becomes negative, so that electrostatic repulsion occurs between the surface of silica and the surface of n-type doped polysilicon, and the polishing speed of the n-type doped polysilicon is further suppressed.

Since the nitrogen-containing alkaline compound also plays a role as a pH adjusting agent for the polishing composition, the amount of the nitrogen-containing alkaline compound added may be appropriately adjusted so that the pH of the polishing composition exceeds 9. As an example, in a case where L-arginine is used, the amount added is preferably 0.1% by mass or more and 5% by mass or less, and more preferably 0.5% by mass or more and 3% by mass or less, based on the total mass of the polishing composition.

[Hydrogen Peroxide]

The polishing composition of the present invention contains hydrogen peroxide. The hydrogen peroxide acts as an oxidizing agent that oxidizes the surface of the object to be polished (particularly, n-type doped polysilicon), and can improve the polishing speed.

The content (concentration) of hydrogen peroxide is more than 0% by mass and less than 0.03% by mass with respect to the total mass of the polishing composition. In a case where the content of the hydrogen peroxide is 0% by mass, that is, in a case where the hydrogen peroxide is not contained, the selectivity is low. On the other hand, when the content of hydrogen peroxide is 0.03% by mass or more, the polishing speed of undoped polysilicon is decreased. The content of hydrogen peroxide is preferably more than 0% by mass and 0.02% by mass or less, and more preferably more than 0% by mass and less than 0.01% by mass.

[Dispersing Medium]

The polishing composition of the present invention preferably contains a dispersing medium for dispersing each component. Examples of the dispersing medium include water; alcohols such as methanol, ethanol, and ethylene glycol; ketones such as acetone or the like, mixtures thereof, and the like. Among these, water is preferable as the dispersing medium. That is, according to a more preferable embodiment of the present invention, the dispersing medium contains water. According to a more preferable embodiment of the present invention, the dispersing medium contains substantially water. Note that, the above "substantially" means that a dispersing medium other than water can be contained as long as the object effect of the present invention can be achieved, and more specifically, it preferably consists of water of 90% by mass or more and 100% by mass or less and a dispersing medium other than water of 0% by mass or more and 10% by mass or less, and it more preferably consists of water of 99% by mass or more and 100% by mass or less and a dispersing medium other than water of 0% by mass or more and 1% by mass or less. Most preferably, the dispersing medium is water.

From the viewpoint of not inhibiting the action of the components contained in the polishing composition, as a dispersing medium, water that contains as little impurities as possible is preferable, and specifically, pure water and ultrapure water from which impurity ions have been removed with an ion exchange resin and then foreign substances have been removed through a filter, or distilled water is more preferable.

[pH]

The pH of the polishing composition of the present invention exceeds 9. In a case where the pH is 9 or less, the ratio (selectivity) of the polishing speed of the polycrystalline silicon which is not doped with impurities to the polishing speed of the polycrystalline silicon doped with impurities is decreased.

The pH is preferably 10.0 or higher, and is more preferably 10.5 or higher. On the other hand, from the viewpoint of safety, the pH of the polishing composition is preferably 13.0 or less, more preferably 12.5 or less, still more preferably 12.0 or less, even more preferably 11.5 or less, and most preferably 11.0 or less.

The pH of the polishing composition can be measured by a pH meter (model: LAQUA manufactured by Horiba, Ltd.).

The polishing composition of the present invention contains silica, a nitrogen-containing alkaline compound, and hydrogen peroxide as essential components; however, in a case where it is difficult to obtain a desired pH by these alone, a pH adjusting agent may be added to adjust the pH as long as the effects of the present invention are not impaired.

The pH adjusting agent may be any of acid and a base other than the nitrogen-containing alkaline compound, and may be any of an inorganic compound and an organic compound. The pH adjusting agents may be used either singly or in combination of two or more types.

Specific examples of the acids used as a pH adjusting agent include inorganic acids such as sulfuric acid, nitric acid, boric acid, carbonic acid, hypophosphorous acid, phosphorous acid, and phosphoric acid; carboxylic acids, such as formic acid, acetic acid, propionic acid, butyric acid, valeric acid, 2-methyl butyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid; and organic acids or the like of organic sulfonic acids such as methanesulfonic acid, ethane sulfonic acid, isethionic acid, and the like.

Specific examples of the base that can be used as the pH adjusting agent include compounds other than the above-mentioned nitrogen-containing alkaline compound, for example, a hydroxide of a group 1 element or salt thereof, a hydroxide of a group 2 element or salt thereof, and quaternary ammonium hydroxide or a salt thereof, or the like. Specific examples of the salt include carbonate, bicarbonate, sulfate, and acetate.

The addition amount of the pH adjusting agent is not particularly limited, and may be appropriately adjusted so that the polishing composition is within a desired range.

[Other Components]

The polishing composition of the present invention may, if necessary, further contains known additives that can be used in the polishing composition, such as an oxidizing agent, a complexing agent, an antiseptic agent, and an antifungal agent, as long as the effects of the present invention are not significantly impaired.

[Electrical Conductivity of Polishing Composition]

The electrical conductivity of the polishing composition of the present invention is preferably 0.25 mS/cm or less. Within this range, in a case where the electric double layer on the silica surface becomes thick and the object to be polished contains n-type doped polysilicon, the repulsive force between the silica surface and the n-type doped polysilicon is increased, the polishing speed is suppressed, and the selectivity is more improved. The electrical conductivity is more preferably 0.05 mS/cm or more and 0.25 mS/cm or less. In addition, 1 mS/cm=100 mS/m is satisfied.

The electrical conductivity of the polishing composition can be controlled by appropriately selecting the type and amount of the nitrogen-containing alkaline compound added. Moreover, the electrical conductivity of the polishing composition can be measured by the method described in examples.

[Method for Producing Polishing Composition]

The method for producing the polishing composition of the present invention is not particularly limited, and for example, the polishing composition can be obtained by stirring and mixing for example, silica, a nitrogen-containing alkaline compound, hydrogen peroxide, and if necessary, other additives in a dispersing medium (for example, water). The details of each component are as described above. Therefore, the present invention provides a method of producing a polishing composition of the present invention, including mixing the silica, the nitrogen-containing alkaline compound, and hydrogen peroxide.

The temperature at which each component is mixed is not particularly limited, and is preferably 10° C. or more and 40° C. or less, and heating may be performed to increase a rate of dissolution. In addition, a mixing time is also not particularly limited as long as uniform mixing is possible.

[Polishing Method and Producing Method of Semiconductor Substrate]

As described above, the polishing composition of the present invention is suitably used for polishing an object to be polished containing polycrystalline silicon which is not doped with impurities and polycrystalline silicon which is doped with n-type impurities. Therefore, the present invention provides a polishing method of polishing an object to be polished containing the polycrystalline silicon which is not doped with impurities and polycrystalline silicon doped with n-type impurities with the polishing composition of the present invention. In addition, the present invention also provides a method of producing a semiconductor substrate, including polishing a semiconductor substrate containing the polycrystalline silicon which is not doped with impurities and the polycrystalline silicon which is doped with n-type impurities with the above-mentioned polishing method.

As a polishing apparatus, it is possible to use a general polishing apparatus to which a holder for holding a substrate or the like having an object to be polished and a motor or the like capable of changing the rotation speed are attached, and which includes a polishing table to which a polishing pad (polishing cloth) can be attached.

As the polishing pad, general non-woven fabric, polyurethane, porous fluororein and the like can be used without particular limitation. It is preferable that the polishing pad is subjected to groove processing so that a polishing solution is accumulated.

Regarding the polishing conditions, for example, the rotation speed of the polishing table is preferably 10 rpm or more and 500 rpm or less. The pressure (polishing pressure) applied to the substrate having the object to be polished is preferably 0.5 psi or more and 10 psi or less. The method for supplying the polishing composition to the polishing pad is not particularly limited, and for example, a method for continuously supplying the composition with a pump or the like is employed. The amount supplied is not particularly limited, the surface of the polishing pad is preferably covered with the polishing composition of the present invention all the time.

After completion of the polishing, the substrate is washed in flowing water, and water droplets adhering to the substrate are removed by a spin dryer or the like to dry the substrate, thereby obtaining a substrate having a metal-containing layer.

The polishing composition of the present invention may be a one-component type or a multi-component type including a two-component type. In addition, the polishing composition of the present invention may be prepared by diluting, for example, 10 times or more of the stock solution of the polishing composition with a diluent such as water.

Although the embodiments of the present invention have been described in detail, note that this is illustrative and exemplary, and not limiting, and the scope of the present invention is to be interpreted by the appended claims.

The present invention includes the following aspects and embodiments.

1. A polishing composition containing silica, a nitrogen-containing alkaline compound, and hydrogen peroxide, wherein a content of the hydrogen peroxide is more than 0% by mass and less than 0.03% by mass with respect to the total mass of the polishing composition, and a pH exceeds 9.

2. The polishing composition according to 1. above, wherein the nitrogen-containing alkaline compound is basic amino acid.

3. The polishing composition according to 1. or 2. above, wherein the content of hydrogen peroxide is more than 0% by mass and 0.02% by mass or less.

4. The polishing composition according to 3. above, wherein the content of hydrogen peroxide is more than 0% by mass and less than 0.01% by mass.

5. The polishing composition according to any one of 1. to 4. above, wherein electrical conductivity is 0.25 mS/cm or less.

6. The polishing composition according to 5. above, wherein the electrical conductivity is 0.05 mS/cm or more and 0.25 mS/cm or less.

7. The polishing composition according to any one of 1. to 6. above, which is used for polishing an object to be polished containing polycrystalline silicon which is not doped with impurities and polycrystalline silicon which is doped with n-type impurities.

8. A polishing method including polishing an object to be polished using the polishing composition according to any one of 1. to 7. above.

9. A method of producing a semiconductor substrate, including polishing a semiconductor substrate containing polycrystalline silicon which is not doped with impurities and polycrystalline silicon which is doped with n-type impurities with the polishing method according to 8. above.

EXAMPLES

The present invention will be further described in detail using the following examples and comparative examples. Here, the technical scope of the present invention is not limited to the following examples. In addition, unless otherwise specified, "%" and "parts" mean "% by mass" and "parts by mass", respectively.

300 mm of blanket wafers containing undoped polysilicon and phosphorus-doped polysilicon (doped amount: $3 \times 10^{20}$ atoms/cc) were prepared as an object to be polished. A polishing test was performed using a coupon obtained by cutting each wafer into a chip of 60 mm×60 mm as a test piece.

The average primary particle size of the silica was calculated from the specific surface area of the silica measured by a BET method using "Flow Sorb II 2300" manufactured by Micromeritics and the density of the silica. Further, the average secondary particle size of the silica was measured by particle size distribution device UPA-UTI 151 manufactured by Nikkiso Co., Ltd., besed on a dynamic light scattering particle diameter.

The pH of the polishing composition (liquid temperature: 25° C.) was confirmed with a pH meter (model: LAQUA manufactured by Horiba, Ltd.).

The electrical conductivity (unit: mS/cm) of the polishing composition (liquid temperature: 25° C.) was measured using a desktop electric conductivity meter (manufactured by HORIBA, Ltd., model number: DS-71).

<Preparation of Polishing Composition>

Example 1

A polishing composition was prepared by stirring and mixing colloidal silica (average primary particle size: 35 nm, average secondary particle size: 66.1 nm), L-arginine as a nitrogen-containing alkaline compound, and hydrogen peroxide in a dispersing medium (pure water) (mixing temperature: about 25° C., mixing time: about 10 minutes).

The content of colloidal silica in the polishing composition was 2% by mass, and the content of hydrogen peroxide was 0.0027% by mass. In addition, L-arginine was added in an amount such that the pH of the polishing composition was 10.6.

Examples 2 to 12 and Comparative Examples 1 to 7

A polishing composition was prepared in the same manner as in Example 1 except that the type of nitrogen-containing alkaline compound, the pH of the polishing composition, and the content of hydrogen peroxide were changed as indicated in Table 1 below. The nitrogen-containing alkaline compound was added in an amount at which the pH of the polishing composition indicated in Table 1 was obtained. Comparative Example 1 is an example in which hydrogen peroxide is not added.

<Evaluation>

Using each of the polishing compositions obtained above, the polishing speed when each of the above objects to be polished was polished under the following polishing conditions was measured.

(Polishing Device and Polishing Conditions)

Polishing device: Small tabletop grinder (manufactured by Engis Japan Corporation., EJ380IN)

Polishing pad: Nitta Haas Incorporated., Hard polyurethane pad IC1010

Polishing pressure: 2.25 psi (1 psi=6894.76 Pa)

Platen (table) rotation speed: 60 rpm

Head (carrier) rotation speed: 60 rpm

Supply of polishing composition: Flowing

Supply amount of polishing composition: 100 mL/min

Polishing time: 30 seconds for undoped polysilicon, 60 seconds for phosphorus-doped polysilicon.

(Polishing Speed)

The polishing speed (polishing rate) was calculated by the following equation. Note that, 1 Å=0.1 nm is established.

[Equation 1]

$$\text{Polishing rate [Å/min]} = \frac{\text{Film Thickness before polishing [Å]} - \text{Film Thickness after polishing [Å]}}{\text{Polishing time [min]}}$$

The film thickness was determined by light interference type film thickness measurement apparatus, Lambda Ace VM-2030 manufactured by SCREEN Semiconductor Solutions Co., Ltd., and evaluated by dividing the difference in film thickness before and after polishing by the polishing time. The results are indicated in Table 1.

[Table 1]

|  | Polishing composition | | | | Polishing speed | | |
| --- | --- | --- | --- | --- | --- | --- | --- |
|  | Nitrogen-containing alkaline compound | pH | Electrical conductivity (mS/cm) | Content of hydrogen peroxide (% by mass) | Undoped polysilicon (Å/min) | Phosphorus-doped polysilicon (Å/min) | Ratio of undoped/phosphorus-doped |
| Example 1 | L-arginine | 10.6 | 0.22 | 0.0027 | 2235 | 99 | 22.6 |
| Example 2 | L-arginine | 10.6 | 0.22 | 0.0053 | 1904 | 57 | 33.4 |
| Example 3 | L-arginine | 10.6 | 0.22 | 0.0106 | 1433 | 25 | 57.3 |
| Example 4 | L-arginine | 10.6 | 0.22 | 0.0142 | 1429 | 14 | 102.1 |
| Example 5 | L-arginine | 10.6 | 0.22 | 0.0170 | 1417 | 11 | 128.8 |
| Example 6 | L-arginine | 10.6 | 0.22 | 0.0213 | 1272 | 9 | 141.3 |
| Example 7 | L-arginine | 10.6 | 0.22 | 0.0248 | 1102 | 8 | 137.8 |
| Example 8 | L-arginine | 10.6 | 0.22 | 0.0283 | 1003 | 10 | 100.3 |
| Example 9 | L-arginine | 10.0 | 0.07 | 0.0170 | 1207 | 8 | 150.9 |
| Example 10 | L-histidine | 10.5 | 0.08 | 0.0170 | 1421 | 29 | 49.0 |
| Example 11 | Ethylenediamine | 10.5 | 0.16 | 0.0170 | 1907 | 152 | 12.5 |
| Example 12 | Diglycolamine | 10.5 | 0.16 | 0.0170 | 1878 | 160 | 11.7 |

-continued

| | Polishing composition | | | | Polishing speed | | |
|---|---|---|---|---|---|---|---|
| | Nitrogen-containing alkaline compound | pH | Electrical conductivity (mS/cm) | Content of hydrogen peroxide (% by mass) | Undoped polysilicon (Å/min) | Phosphorus-doped polysilicon (Å/min) | Ratio of undoped/phosphorus-doped |
| Comparative Example 1 | L-arginine | 10.6 | 0.22 | 0 | 2260 | 2531 | 1.1 |
| Comparative Example 2 | L-arginine | 10.6 | 0.22 | 0.0319 | 671 | 14 | 47.9 |
| Comparative Example 3 | L-arginine | 10.6 | 0.22 | 0.0354 | 221 | 10 | 22.1 |
| Comparative Example 4 | L-arginine | 10.6 | 0.22 | 0.0389 | 107 | 9 | 11.9 |
| Comparative Example 5 | L-arginine | 10.6 | 0.22 | 0.0425 | 83 | 39 | 2.1 |
| Comparative Example 6 | L-arginine | 9.0 | 0.02 | 0.0170 | 1101 | 404 | 2.7 |
| Comparative Example 7 | Potassium hydroxide | 10.5 | 0.26 | 0.0170 | 1454 | 1739 | 0.8 |

As is clear from Table 1 above, it was found that in the polishing composition of the example, a polishing speed of undoped polysilicon is sufficiently high, and the ratio (selectivity) of the polishing speed of undoped polysilicon to the polishing speed of phosphorus-doped polysilicon is sufficiently high as compared with the polishing composition of the comparative example. In particular, it was found that the polishing compositions of Examples 1 and 2 had an excellent balance between the polishing speed and the selectivity of undoped polysilicon.

This application is based on Japanese Patent Application No. 2020-25618 filed on Feb. 18, 2020, the disclosure of which is incorporated herein by reference in entirety thereof.

What is claimed is:

1. A polishing composition consisting of:
   silica;
   a basic amino acid;
   hydrogen peroxide; and
   a dispersing medium,
   wherein a content of the hydrogen peroxide is 0.0027% by mass or more and less than 0.03% by mass with respect to the total mass of the polishing composition,
   an electrical conductivity of 0.05 mS/cm or more and 0.25 mS/cm or less, and
   a pH of 10.0 or higher and 11.0 or lower.

2. The polishing composition according to claim 1, wherein the basic amino acid is arginine.

3. The polishing composition according to claim 1, wherein the content of hydrogen peroxide is 0.0027% by mass or more and 0.02% by mass or less.

4. The polishing composition according to claim 3, wherein the content of hydrogen peroxide is 0.0027% by mass or more and less than 0.01% by mass.

5. The polishing composition according to claim 1, wherein the electrical conductivity is 0.07 mS/cm or more and 0.22 mS/cm or less.

6. The polishing composition according to claim 1, which is used for polishing an object to be polished containing polycrystalline silicon which is not doped with impurities and polycrystalline silicon which is doped with n-type impurities.

7. A polishing method comprising: polishing an object to be polished using the polishing composition according to claim 1.

8. A method of producing a semiconductor substrate, comprising:
   polishing a semiconductor substrate containing polycrystalline silicon which is not doped with impurities and polycrystalline silicon which is doped with n-type impurities with the polishing method according to claim 7.

9. The polishing composition according to claim 1, wherein an average association degree of the silica is 1.0 or more and 5.0 or lower.

10. The polishing composition according to claim 1 which is used for polishing an object to be polished containing polycrystalline silicon which is not doped with impurities and polycrystalline silicon which is doped with n-type impurities, wherein the content of n-type impurities is $1.0 \times 10^{13}$ atoms/cc or more and $5.0 \times 10^{21}$ atoms/cc or less.

11. The polishing composition of claim 1, wherein the dispersing medium is water.

* * * * *